(12) United States Patent
Kim et al.

(10) Patent No.: US 9,664,946 B2
(45) Date of Patent: May 30, 2017

(54) DISPLAY DEVICE HAVING FUNCTIONAL PANEL

(71) Applicant: LG Display Co., Ltd., Seoul (KR)

(72) Inventors: HyunKi Kim, Daegu (KR); Moojin Kim, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/086,498

(22) Filed: Mar. 31, 2016

(65) Prior Publication Data

US 2016/0291404 A1  Oct. 6, 2016

(30) Foreign Application Priority Data

Mar. 31, 2015 (KR) .................. 10-2015-0045758

(51) Int. Cl.
*G02F 1/1333* (2006.01)
*G02F 1/1335* (2006.01)
*H01L 29/786* (2006.01)
*H01L 27/12* (2006.01)

(52) U.S. Cl.
CPC .. *G02F 1/133528* (2013.01); *G02F 2201/503* (2013.01); *G02F 2202/28* (2013.01); *H01L 27/124* (2013.01); *H01L 27/1222* (2013.01); *H01L 29/78669* (2013.01)

(58) Field of Classification Search
CPC ......... G02F 1/133528; G02F 2201/503; G02F 2202/28
USPC ............................................................ 349/58
See application file for complete search history.

(56) References Cited

U.S. PATENT DOCUMENTS

2013/0321293 A1* 12/2013 Park .................. G06F 3/041
345/173

* cited by examiner

*Primary Examiner* — Lucy Chien
(74) *Attorney, Agent, or Firm* — Morgan, Lewis & Bockius LLP (57) ABSTRACT

A display is disclosed that may prevent a polarizing layer of a display area from being delaminated from a functional panel by absorbing impact caused by an external force by an adhesive enhancement layer arranged outside the polarizing layer on a color filter substrate and an adhesive layer arranged between a non-display area of a transistor substrate and a light emitting portion.

17 Claims, 6 Drawing Sheets

DISPLAY DEVICE HAVING FUNCTIONAL PANEL

CROSS REFERENCE TO RELATED APPLICATIONS

This application claims the benefit of the Korean Patent Application No. 10-2015-0045758 filed on Mar. 31, 2015, which is hereby incorporated by reference for all purposes as if fully set forth herein.

BACKGROUND OF THE INVENTION

Field of the Invention

The present invention relates to a display device, and more particularly, to a display device having a functional panel attached thereto.

Discussion of the Related Art

Recently, with the development of various portable electronic devices such as a mobile phone, a PDA, a tablet PC, and a laptop PC and large-scaled electronic devices, the demand for flat panel display devices has gradually increased. As such flat panel display devices, Liquid Crystal Display (LCD), Organic Light Emitting Display (OLED), etc. have been studied.

Meanwhile, it is general that a personal computer, a portable communication device and the other personal information processing devices configure an interface with a user by using various input devices such as a keyboard, a mouse and a digitizer. In addition, with the development of portable electronic devices, a flat panel display device has been suggested, which facilitates information input of a user by attaching a touch panel to a liquid crystal panel, wherein the touch panel allows the user to input information directly in contact with a screen through a hand or pen.

As described above, the flat panel display device may be used as a flat panel display device of various functions by attaching various functional panels such as the touch panel, protective film or protective glass for protecting the device onto its entire surface.

The flat panel display device and the functional panel are attached to each other by an adhesive made of a transparent resin, etc. The adhesion between the flat panel display device and the functional panel with the adhesive causes problems as follows.

A portable electronic device, such as a tablet PC or a mobile phone to which a functional panel such as a touch panel or a protective panel is attached, is mainly used while moving. However, an external force, such as movement or impact, may damage an adhesive between the functional panel and the flat panel display device. Therefore, a problem occurs in that a polarizing layer is delaminated from the functional panel. If this delamination of the polarizing layer, which starts from an outer area of the display device, is extended to a display area (that is, if delamination of the polarizing layer occurs in the display area), a defect occurs in transmissivity of light that transmits the polarizing layer. Thereby a picture quality defect occurs that was caused by white spots on a screen.

SUMMARY OF THE INVENTION

Accordingly, the present invention is directed to a display device having a functional panel that substantially obviates one or more problems due to limitations and disadvantages of the related art.

An object of the present invention is to provide a display device that may prevent a polarizing layer of a display area from being delaminated from a functional panel by absorbing impact caused by an external force through an adhesive enhancement layer arranged outside the polarizing layer on a color filter substrate, and an adhesive layer arranged between a non-display area of a transistor substrate and a light emitting portion.

Additional features and advantages of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device comprises a display panel that includes a polarizing layer; a functional panel on the display panel; a first adhesive layer disposed between the polarizing layer and the functional panel, and more extended than the polarizing layer; an adhesive enhancement layer contacting a side of the polarizing layer, and enhancing adhesion between the first adhesive layer and the polarizing layer; and a second adhesive layer including a double sided adhesive member and a single sided adhesive member, and serving as adhesion and impact reduction between the display panel and a guide member.

In one or more embodiments, the adhesive enhancement layer contacts the first adhesive layer and may be thicker outwardly from the side of the polarizing layer.

In one or more embodiments, the adhesive enhancement layer is either nonconductive polyethyleneterepthalate or silicon material.

In one or more embodiments, the display panel further includes a transistor substrate and a color filter substrate, the polarizing layer may be disposed on the color filter substrate, and the color filter substrate may be disposed on the transistor substrate and more extended than the polarizing layer.

In one or more embodiments, the display device further comprises a conductive tape between the adhesive enhancement layer and the color filter substrate.

In one or more embodiments, the conductive tape is either ITO tape or IZO tape.

In one or more embodiments, the transistor substrate further includes a display area and a non-display area surrounding the display area, and the second adhesive layer may be disposed on the non-display area.

In one or more embodiments, the single sided adhesive member is disposed in at least one corner area of the second adhesive layer.

In one or more embodiments, the single sided adhesive member disposed in the at least one corner area has a 'L' shape.

In one or more embodiments, the double sided adhesive member and the single sided adhesive member are alternately arranged.

In one or more embodiments, the at least one corner area has a round shape.

In one or more embodiments, a boundary portion between the single sided adhesive member and the double sided adhesive member has a stair shape.

In one or more embodiments, the single sided adhesive member is arranged at the outside of the corner area, and the double sided adhesive member is arranged at the inside facing the outside.

In one or more embodiments, the single sided adhesive member is attached to the guide member.

In one or more embodiments, a part of the single sided adhesive member is attached to the display panel.

In one or more embodiments, the single sided adhesive member is not attached to the display panel to minimize impact caused by an external force applied to the display panel.

In one or more embodiments, the second adhesive layer is either nonconductive polyethyleneterepthalate or silicon material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the preferred embodiments of the present invention will be described in detail with reference to the accompanying drawings.

Figure 1:
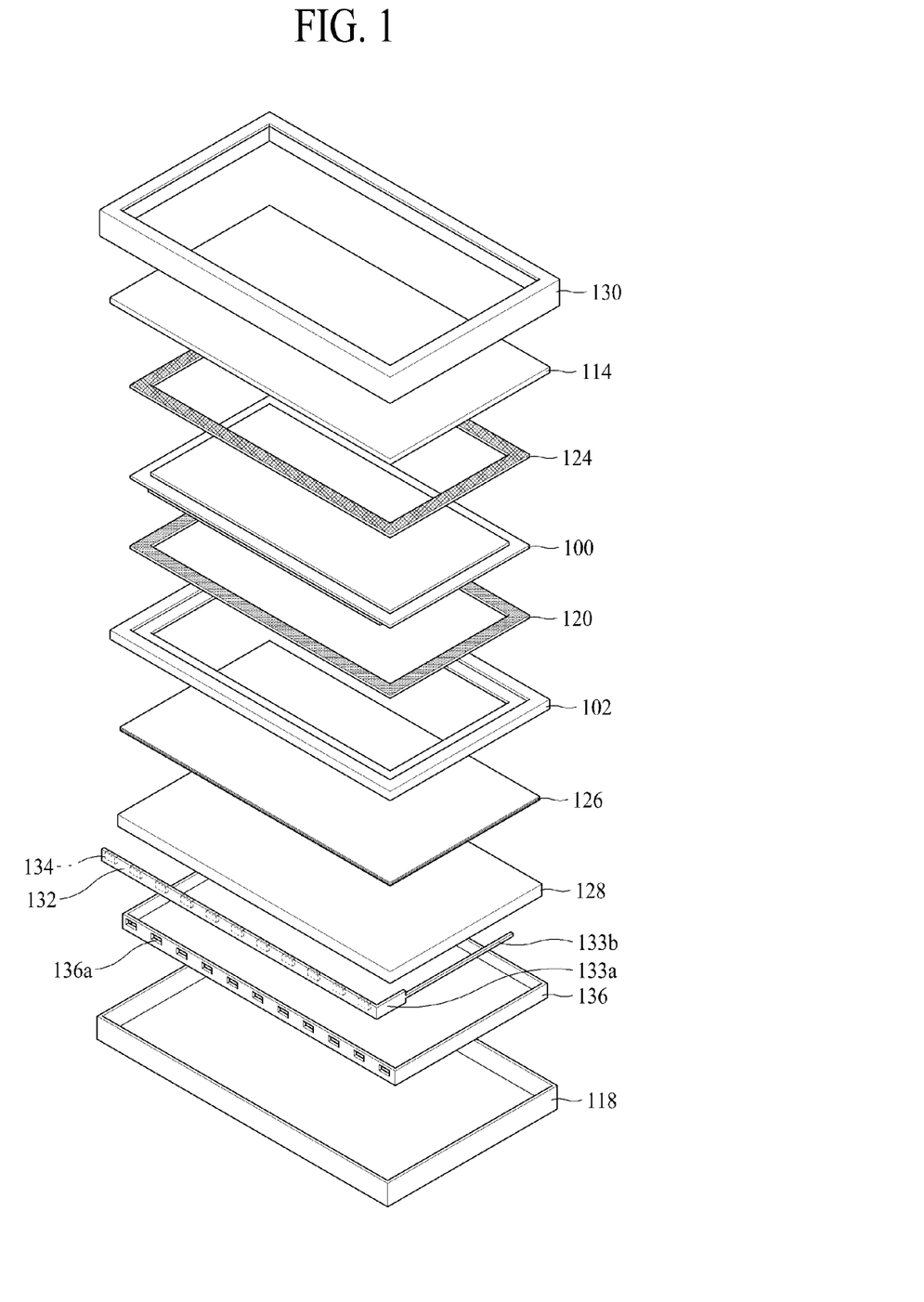
FIG. 1 is an exploded perspective view illustrating a display device according to one embodiment of the present invention.
Figure 2:
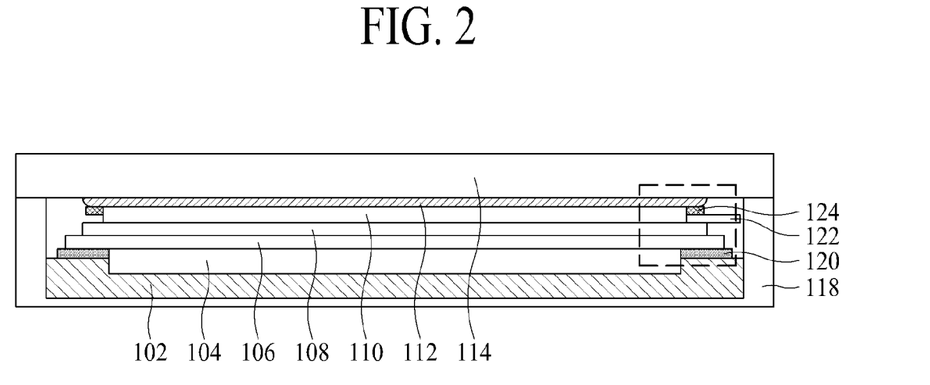
FIG. 2 is a cross-sectional view illustrating a display device according to one example embodiment of the present invention.

FIG. 1 is an exploded perspective view illustrating a display device according to one example embodiment of the present invention, and FIG. 2 is a cross-sectional view illustrating a display device according to one example embodiment of the present invention. Although various display devices may be applied to the display device, a liquid crystal display device will be described exemplarily in the drawings for convenience of description. However, it is to be understood that the scope of the present invention is not limited by an example of a specific display device and the present invention may be applied to various flat panel display devices such as a liquid crystal display device, an organic electroluminescence display device, a plasma display device and an electrophoretic display device.

As shown in FIGS. 1 and 2, the liquid crystal display device according to the present invention includes a display panel 100 based on a liquid crystal, and a light emitting portion. The light emitting portion may be disposed below the display panel 100.

The display panel 100 may include a first polarizing layer 104, a transistor substrate 106, a color filter substrate 108, a second polarizing layer 110, and a liquid crystal layer. The liquid crystal layer may be disposed between the transistor substrate 106 and the color filter substrate 108. The first polarizing layer 104 may be disposed below the transistor substrate 106. The second polarizing layer 110 may be disposed above the color filter substrate 108.

Light supplied from the light emitting portion to the display panel may transmit the first polarizing layer 104. At this time, the light that has supplied from the light emitting portion to the display panel 100 may partially be absorbed by the first polarizing layer 104. The light may transmit the liquid crystal layer. At this time, liquid crystals of the liquid crystal layer may be rotated to correspond to an image signal. Therefore, a polarizing axis of the light that has transmitted the liquid crystal layer may be rotated. The light that has transmitted the liquid crystal layer may transmit the second polarizing layer 110. At this time, the light that has transmitted the liquid crystal layer may partially be absorbed by the second polarizing layer 110.

The light emitting portion may include a guide member 102, a lower cover 118, an optical sheet 126, a light guide plate 128, an LED substrate 132, LEDs 134 and a reflective plate 136. A plurality of LEDs (Light Emitting Devices) 134 are packaged in the LED substrate 132. The LEDs 134 are arranged at a side below the display panel 100 to emit light. The light guide plate 128 guides the light emitted from the LEDs 134 to supply the light to the display panel 100. The optical sheet 126 may be disposed between the display panel 100 and the light guide plate 128. The optical sheet 126 may diffuse and condense the light guided by the light guide plate 128 and supplied to the display panel 100. At this time, the optical sheet 126 may include a diffusion sheet and a prism sheet. The reflective plate 136 is arranged below the light guide plate 128 to reflect the light guided to the lower portion of the light guide plate 128.

The LED substrate 132, the LEDs 134, the reflective plate 136, the light guide plate 128 and the optical sheet 126 are stored in the lower cover 118. The light emitting portion is assembled as the lower cover 118 and the guide member 102 are coupled to each other.

The display panel 100 is disposed above the guide member 102, and a functional panel 114 is disposed above the display panel 100.

The upper cover 130 is arranged on anouter area of the functional panel 114, and may be coupled with the lower cover 118. Therefore, the liquid crystal display device can be comprised of combination of the display panel 100, the functional panel 114 and the light emitting portion.

The transistor substrate 106 includes a plurality of gate lines and a plurality of data lines. The plurality of gate lines are arranged to cross the plurality of data lines, thereby defining a plurality of pixel regions. A thin film transistor which is a switching device may be disposed in each pixel area. A pixel electrode may be disposed in each pixel area. Also, the thin film transistor may include a gate electrode, a semiconductor layer, a source electrode, and a drain electrode. The gate electrode may be connected with the gate lines. The semiconductor layer may be disposed in such a manner that amorphous silicones are deposited on the gate electrode. The semiconductor layer may be made of various materials such as oxide semiconductor or organic semiconductor. The source electrode and the drain electrode may be disposed above the semiconductor layer, and may be connected to the data lines and the pixel electrodes.

The color filter substrate 108 includes a color filter and a black matrix. The color filter includes a plurality of sub-color filters that display colors of red (R), green (G), and blue (B). The black matrix may identify the sub-color filters from one another and shield the light that transmits the liquid crystal layer.

The transistor substrate 106 may include a display area and a non-display area surrounding the display area.

The display area means an area where image is displayed by driving of the display device. The non-display area means an outer area of the display area, where image is not displayed. A sealant may be coated on the non-display area. The display panel may be comprising such a manner that the transistor substrate 106 and the color filter substrate 108 are assembled to each other by the sealant.

The first polarizing layer 104 may be disposed below the transistor substrate 106. The first polarizing layer 104 may be attached to the transistor substrate 106. The second polarizing layer 110 may be disposed above the color filter substrate 108. The second polarizing layer 110 may be attached to the color filter substrate 108. The first polarizing layer 104 and the second polarizing layer 110 may polarize the light input to and output from the display panel 100. So the first polarizing layer 104 and the second polarizing layer 110 may control transmissivity of the light, a thereby the liquid crystal display device may display a picture image.

The light guide plate 128 may guide the light, which is supplied from the LEDs 134, to the display panel 100. The light entering one side of the light guide plate 128 is reflected on upper and lower surfaces of the light guide plate 128 and propagated to the other side of the light guide plate 128, the light may be output to the outside of the light guide plate 128. The light guide plate 128 may be made of, but not limited to, PMMA (Polymethyl-Methacrylate). The light guide plate 128 may include a pattern or holes disposed to scatter the light entering its lower surface. The pattern or holes of the light guide plate 128 may upwardly reflect the light incident through a light incident surface.

The optical sheet 126 may supply the light, which is output from the light guide plate 128, to the display panel 100. The optical sheet 126 may improve efficiency of the light output from the light guide plate 128. The optical sheet 126 may include a diffusion sheet, a first prism sheet, and a second prism sheet. The diffusion sheet may diffuse the light output from the light guide plate 128. The first prism sheet and the second prism sheet may condense the light diffused by the diffusion sheet and uniformly supply the light to the display panel 100. Although one diffusion sheet is disposed, two prism sheets, that is, the first prism sheet and the second prism sheet, which vertically cross each other in x-axis direction and y-axis direction, are disposed to refract the light in the x-axis direction and y-axis direction, whereby linearity of the light may be improved.

R, G, B LEDs emitting single colored light of R(Red),G (Green),B(Blue), or LED emitting white colored light may be used as the LEDs 134.

If the LEDs emitting single colored light are arranged, the single colored LEDs of R,G,B may be arranged alternately at constant intervals. At this time, the single colored light emitted from the single colored LEDs may be mixed with the white colored light and then supplied to the display panel 100. Also, if the LEDs emitting white colored light are disposed, the plurality of LEDs may be arranged at constant intervals. At this time, the white colored light emitted from the white colored LEDs may be supplied to the display panel 100.

The white colored LEDs may be comprised of the blue LED and a fluorescent substance emitting yellow colored light by absorbing single colored light of the blue LED. The blue colored light output from the blue LED and the yellow colored light emitted from the fluorescent substance may be mixed with each other. The white colored light formed by mixture of the singled colored lights may be supplied to the display panel 100. In FIG. 1, although the LEDs 134 are arranged at one side of the light guide plate 128, the LEDs 134 may be arranged at both sides of the light guide plate 128.

The LEDs 134 may be diposed on the LED substrate 132 made of metal or flexible film. The LED substrate 132 may be arranged along the side of the light guide plate 128 to face the side of the light guide plate 128. The light from the LEDs 134 may enter the light guide plate 128 through the side of the light guide plate 128.

A flexible circuit board 133*a* is attached and connected to the end of the LED substrate 132. A wire 133*b* may be attached to the end of the flexible circuit board 133*a*. The flexible circuit board 133*a* and the wire 133*b* may connect the LEDs 134 disposed on the LED substrate 132 with an external driving circuit of the liquid crystal display device. An external signal and power are supplied to an LED controller, and the LED controller may drive the LEDs 134 in accordance with the input signal. A signal line is disposed on an upper surface or a lower surface of the flexible circuit board 133*a*, and may electrically be connected with the wire 133*b*. Therefore, the signal of the driving circuit may be input to the LED substrate 132 through the signal line of the flexible circuit board 133*a* and the wire 133*b*.

Meanwhile, in the present invention, light sources supplying the light to the display panel 100 are not limited to the LEDs. In the present invention, the LEDs are described exemplarily as the light sources for convenience of description.

A fluorescent lamp such as CCFL (Cold Cathode Fluorescent Lamp) or EEFL (External Electrode Fluorescent Lamp) may be used as the light source of the present invention. If the fluorescent lamp is used, it is not required to use the LED substrate 132, and a lamp housing for storing a fluorescent lamp may be arranged at one side of the light guide plate 128. A reflective material is coated on an inner surface of the lamp housing to reflect the light emitted from the fluorescent lamp towards the side of the light guide plate 128, whereby light efficiency is improved.

The lower cover 118 may be comprised of a bottom disposed below the reflective plate 136 and a sidewall that fixes the side of the light guide plate 128 and a rear surface of the LED substrate 132. The reflective layer, the light guide plate 128, and the optical sheet 126 may be stored in the lower cover 118, whereby the light emitting portion may be assembled. Also, an external driving portion may be disposed outside the lower cover 118, whereby a signal may be applied to the display panel 100 and the LEDs 134.

The reflective plate 136 may be extended to the side of the light guide plate 128 and a part of the upper surface of the light guide plate 128 as well as the lower surface of the light guide plate 128. An area corresponding to the LEDs 134 may be removed from the reflective plate 136 at which the LEDs 134 are arranged. Therefore, the reflective plate 136 may include a window 136*a*, and the LEDs 134 may be arranged at the window 136*a*.

Also, the reflective plate 136 may only be arranged below the light guide plate 128 without being extended to the side of the light guide plate 128 and the part of the upper surface of the light guide plate 128. The LEDs 134 may be stored in a separate housing with an inner surface on which a reflective material is coated, and may be arranged at one side of the light guide plate 128.

The display panel 100 may be disposed on the guide member 102. The guide member 102 may be disposed in a shape of a quadrangle. At this time, the outer area of the display panel 100 is disposed on an outer area of the guide member 102.

The functional panel 114 may be disposed on the display panel 100. The functional panel 114, for example, may be a cover glass, which prevents the display panel 100 from being damaged by absorbing external impact, or a touch panel on which data are input by a touch of a hand of user or pens. In addition, various functional panels 114 having various functions may be used.

The functional panel 114 may be attached to the display panel 100 by an adhesive made of a transparent resin such as OCA (Optical Clear Adhesive) and OCR (Optical Clear Resin). Every transparent material that can emit the light from the display panel 100 without any change of a light path such as refraction or change of light property may be used as the adhesive.

The adhesive enhancement layer 124 is attached on the color filter substrate 108. At this time, the adhesive enhancement layer 124 may be diposed on the outer area above the color filter substrate 108. Particularly, the adhesive enhancement layer 124 may be attached to the second polarizing layer 110 along the outer area of the second polarizing layer 110. The adhesive enhancement layer 124 is in contact with the side of the second polarizing layer 110. That is, the adhesive enhancement layer 124 may contact the side of the second polarizing layer 110.

The adhesive enhancement layer 124 may be made of, but not limited to, nonconductive polyethyleneterepthalate or silicon material.

A conductive tape 122 may be disposed below the adhesive enhancement layer 124. The conductive tape 122 may be an ITO (Indium Tin Oxide) tape or IZO (Indium Zinc Oxide) tape made by forming a transparent metal oxide layer such as ITO or IZO on a film made of resin. The metal oxide layer of the conductive tape 122 may be attached to the upper surface (surface to which the second polarizing layer 110 is attached) of the color filter substrate 108. The conductive tape 122 may be extended to the outside of the display panel 100, and may be connected to the same metal part as that of the lower cover 118. Therefore, the conductive tape 122 discharges static electricity generated from the display panel 100 externally. However, in the present invention, the conductive tape 122 is not limited to ITO tape or IZO tape. Also, the conductive tape 122 may not be attached to the upper surface of the color filter substrate 108.

The first adhesive layer 112 may be disposed between the second polarizing layer 110 and the functional panel 114.

The first adhesive layer 112 may be disposed by coating a transparent adhesive such as OCA (Optical Clear Adhesive) and OCR (Optical Clear Resin) in accordance with various methods such as slit coating, screen coating and syringe coating.

The first adhesive layer 112 may be more extended than the side of the second polarizing layer 110. Also, the adhesive enhancement layer 124 may be disposed below the extended portion of the first adhesive layer 112. Therefore, the first adhesive layer 112 disposed on the second polarizing layer 110 and the adhesive enhancement layer 124 may assemble (or bond) the functional panel 114 and the display panel 100.

The adhesive enhancement layer 124 may conatact the side of the second polarizing layer 110 and the extended portion of the first adhesive layer 112. Therefore, the adhesive enhancement layer 124 may enhance adhesion between the first adhesive layer 112 and the second polarizing layer 110.

The second adhesive layer 120 is disposed between the non-display area of the transistor substrate 106 and the light emitting portion. The second adhesive layer 120 is partially attached to the non-display area of the transistor substrate 106. And, the second adhesive layer 120 is attached to the guide member 102.

The lower surface of the second adhesive layer 120 is attached to the upper surface of the guide member 102. On the other hand, the upper surface of the second adhesive layer 120 is partially attached to the lower surface of the transistor substrate 106.

The second adhesive layer 120 may be made of, but not limited to, nonconductive polyethyleneterepthalate or silicon material.

As described above, in the present invention, the first adhesive layer 112 may be disposed on the adhesive enhancement layer 124 as well as the second polarizing layer 110. The functional panel 114 may be arranged above the second polarizing layer 110 and the adhesive enhancement layer 124. Also, the second adhesive layer 120 is partially attached to the lower surface of the transistor substrate 106 for the following reasons.

According to the related art, the first adhesive layer is arranged on the second polarizing layer without the adhesive enhancement layer 124, whereby the functional panel may be attached to the display panel. In this structure, if an external force such as movement or impact is applied, impact may be applied to a boundary area between the first adhesive layer and the second polarizing layer. The first adhesive layer may be damaged by the impact. Also, according to the related art, the guide member may be arranged below the transistor substrate without the second adhesive layer 120. In this structure, if an external force such as movement or impact is applied (especially if an external force is applied to a corner area), impact may be applied to the boundary area between the first adhesive layer and the second polarizing layer through the transistor substrate and the second polarizing layer. The first adhesive layer (especially, corner area) may be damaged by the impact. As the first adhesive layer is damaged, the second polarizing layer may be delaminated from the first adhesive layer 112 due to deterioration of the adhesion of the first adhesive layer.

In addition, the second polarizing layer may be attached to the display area of the display panel. Therefore, if the second polarizing layer is delaminated from the first adhesive layer, a defect in transmissivity may occur in the display area of the display panel due to the second polarizing layer. For this reason, a defect such as white spots occurs in the display area.

However, according to one embodiment of the present invention, the adhesive enhancement layer 124 may be arranged at the side of the second polarizing layer 110, and the first adhesive layer 112 may be arranged on the second polarizing layer 110 and the adhesive enhancement layer 124 and then attached to the functional panel 114. Therefore, impact caused by an external force may be applied to the outer area of the first adhesive layer 112 where the adhesive enhancement layer 124 is arranged, instead of the first adhesive layer 112 attached to the second polarizing layer 110.

The adhesive enhancement layer 124 may be attached to the area corresponding to the outer area of the display area not the area corresponding to the display area of the display panel 100. Specifically, the adhesive enhancement layer 124 may be attached to the area corresponding to the non-display area of the display panel. Therefore, even though the outer area of the adhesive enhancement layer 124 is delaminated by the external force, the display area of the display panel 100 may not be affected by the delamination actually. Therefore, the defect in transmissivity, which occurs in the display area of the display panel 100 due to the second polarizing layer 110, may be prevented. Therefore, the defect such as white spots may be prevented from occurring in the display area of the display panel 100.

In other words, according to one embodiment of the present invention, the first adhesive layer 112 may be prevented from being damaged by the impact caused by the external force. Also, if the first adhesive layer 112 is damaged, the damaged area of the first adhesive layer 112 may be the outer area not the display area of the display panel 100, whereby the defect in the display area of the display panel 100 may be prevented.

The adhesive enhancement layer 124 may have various shapes. At this time, it is preferable that the upper surface of the adhesive enhancement layer 124 is disposed in a curved shape not a flat shape. The reason why that the upper surface of the adhesive enhancement layer 124 is disposed in a curved shape will be described with reference to FIGS. 3a and 3b.

Figure 3A:
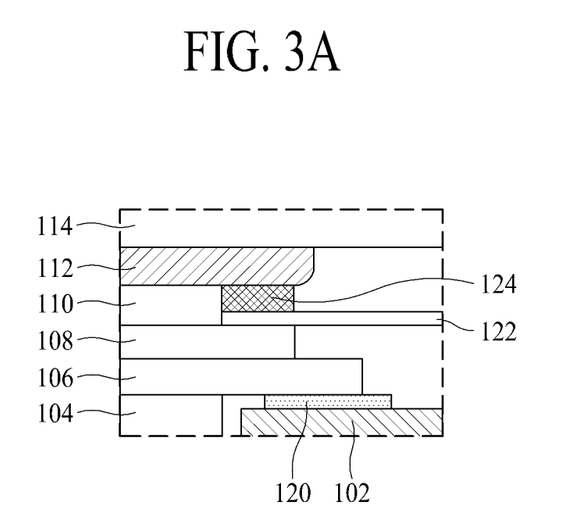
FIG. 3A is a cross-sectional view illustrating an adhesive enhancement layer of a display device according to one example embodiment of the present invention.

FIG. 3A is a cross-sectional view illustrating an adhesive enhancement layer of a display device according to one example embodiment of the present invention.

As shown in FIG. 3A, in case of the adhesive enhancement layer 124 of which upper surface is flat, the upper surface of the adhesive enhancement layer 124 may be disposed to have the same height as that of the second polarizing layer 110. The adhesive enhancement layer 124 may be attached to the side of the second polarizing layer 110. After the first adhesive layer 112 is disposed on the adhesive enhancement layer 124 and the second polarizing layer 110, the functional panel 114 may be attached to the first adhesive layer 112.

When the adhesive enhancement layer 124 is attached to the display panel 100, working tolerance may occur in the adhesive enhancement layer 124. Therefore, a problem may occur in that it is difficult for the upper surface of the adhesive enhancement layer 124 to have the same height as that of the second polarizing layer 110.

When the upper surface of the adhesive enhancement layer 124 is flat, it is not likely that the upper surface of the adhesive enhancement layer 124 is disposed to have the same height as that of the second polarizing layer 110 due to working tolerance of the adhesive enhancement layer 124. Therefore, a defect caused by the working tolerance of the adhesive enhancement layer 124 may occur. In order to solve the defect, it is required to minimize the working tolerance of the adhesive enhancement layer 124. However, since the working tolerance may occur during the manufacturing process of the display device, it is not easy to minimize the working tolerance.

The adhesive enhancement layer will be described with reference to FIG. 3A.

Figure 3B:
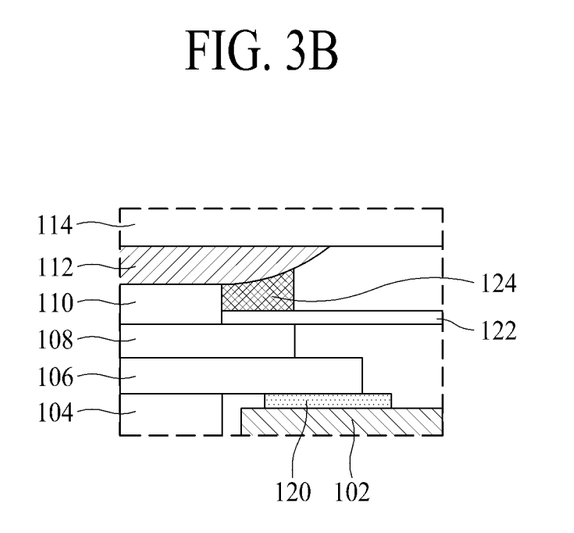
FIG. 3B is a cross-sectional view illustrating an adhesive enhancement layer of a display device according to another example embodiment of the present invention.

FIG. 3B is a cross-sectional view illustrating an adhesive enhancement layer of a display device according to another example embodiment of the present invention.

As shown in FIG. 3B, a thickness of the adhesive enhancement layer 124 is varied per position, whereby the upper surface of the adhesive enhancement layer 124 may be disposed in a curved shape not a flat shape. The upper surface of the adhesive enhancement layer 124 may be disposed to be upwardly curved toward an external direction from the display area of the display panel 100. The adhesive enhancement layer 124 may be disposed to be thicker outwardly from the area where the adhesive enhancement layer 124 contacts the side of the second polarizing layer 110. That is, the upper surface of the adhesive enhancement layer 124 may be disposed in a slant surface, especially a curved shape, which is slanted upwardly towards the outside from the area where the adhesive enhancement layer 124 contacts the side of the second polarizing layer 110.

The first adhesive layer 112 may be disposed by coating an adhesive on the second polarizing layer 110 and the adhesive enhancement layer 124 in accordance with various methods such as slit coating, screen coating and syringe coating. Therefore, if the thickness of the adhesive enhancement layer 124 is varied per position, the adhesion between the second polarizing layer 110 and the first adhesive layer 112 may be enhanced. As a result, the first adhesive layer 112 corresponding to the display area of the display panel 100 may be more prevented from being damaged by the impact caused by the external force. The first adhesive layer 112 above the outer area of the adhesive enhancement layer 124 may be damaged. Therefore, the first adhesive layer 112 and the second polarizing layer 110, which correspond to the display area of the display panel 100, are not delaminated but the first adhesive layer 112 and the second polarizing layer 110 may be delaminated at the outer area of the adhesive enhancement layer 124. That is, the damaged area of the first adhesive layer 112 may be the outer area not the display area of the display device, whereby the defect in the display area may be prevented.

Therefore, the adhesive defect caused by the working tolerance of the adhesive enhancement layer 124 may be solved by change of the shape of the upper surface of the adhesive enhancement layer 124. That is, as shown in FIG. 3B, the upper surface of the adhesive enhancement layer 124 may be disposed to be slanted or disposed in a curved shape, whereby the adhesive defect caused by a height difference between the second polarizing layer 110 and the adhesive enhancement layer 124 may be prevented.

Figure 4:
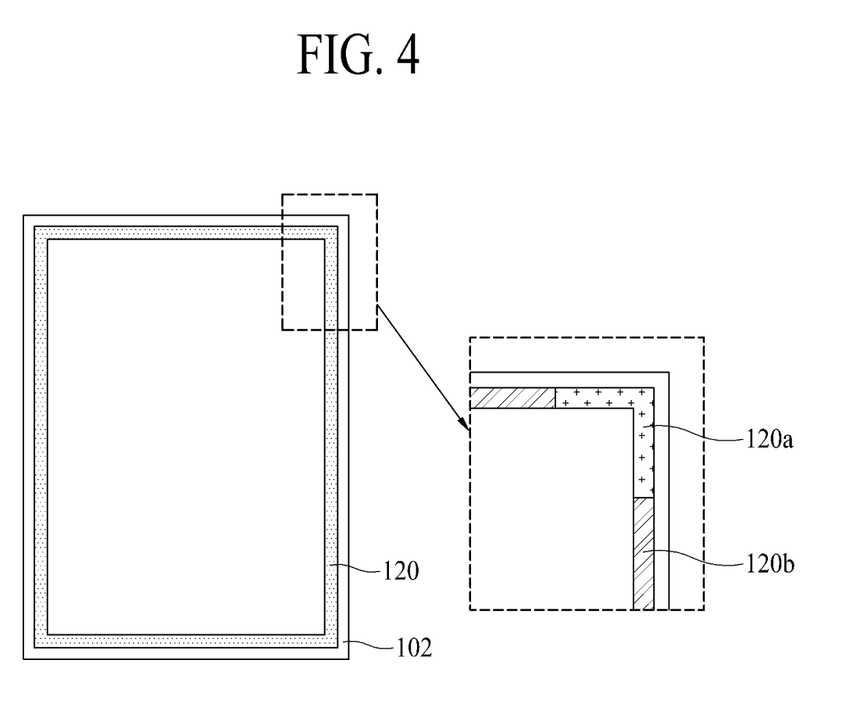
FIG. 4 is a cross-sectional view illustrating a second adhesive layer of a display device according to one example embodiment of the present invention.

FIG. 4 is a cross-sectional view illustrating a second adhesive layer of a display device according to one example embodiment of the present invention.

With reference to FIGS. 3A, 3B, and 4, the second adhesive layer 120 may be disposed between the non-display area of the transistor substrate 106 and the guide member 102 of the light emitting portion. The second adhesive layer 120 is partially attached to the non-display area below the transistor substrate 106.

As shown in FIG. 4, the second adhesive layer 120 may include a double sided adhesive member 120b and a single sided adhesive member 120a. The single sided adhesive member 120a may be attached to the guide member 102. The double sided adhesive member 120b may be attached to the guide member 102 and the transistor substrate 106. The second adhesive layer 120 is partially attached to the non-display area below the transistor substrate 106 due to the single sided adhesive member 120a. The single sided adhesive member 120a may be arranged in at least one corner area of the second adhesive layer 120.

Specifically, the single sided adhesive member 120a attached to the guide member 102 may be arranged in at least one corner area of the second adhesive layer 120 below the transistor substrate 106. Also, the double sided adhesive member 120b attached to the upper surface of the guide member 102 and the lower surface of the transistor substrate 106 may be arranged in the other areas except at least one corner area of the second adhesive layer 120.

As shown in FIG. 4, although the single sided adhesive member 120a basically has a 'L' shape, this is only exemplary, and a substantial shape of the single sided adhesive member 120a is not limited to the above shape.

As shown in FIG. 4, the single sided adhesive member 120a may be arranged in at least one corner area of the second adhesive layer 120 while the double sided adhesive member 120b may be arranged in the other areas except at least one corner area of the second adhesive layer 120. Therefore, at least one corner area of the second adhesive layer 120 is not attached to the lower surface of the transistor substrate 106 for the following reason.

According to the related art, a double sided tape is arranged between a guide member and a transistor substrate, if an external force such as movement or impact is applied to a corner area of the display device, impact may be applied to the corner area of the first adhesive layer arranged between the functional panel and the display panel. Therefore, the corner area of the first adhesive layer may be damaged due to the impact. As a result, the adhesion of the corner area of the first adhesive layer may be deteriorated, whereby the corner area of the second polarizing layer may be delaminated from the first adhesive layer.

However, according to one embodiment of the present invention, the single sided adhesive member 120a may be arranged in at least one corner area of the second adhesive layer 120. The single sided adhesive member 120a may be arranged below the transistor substrate 106. The single sided adhesive member 120a may be attached to the guide member 102 without being attached to the transistor substrate 106. Therefore, at least one corner area of the second adhesive layer 120 may not be attached to at least one corner area of the transistor substrate 106. Also, at least one corner area of the second adhesive layer 120 may be attached to the guide member 102. Therefore, the impact caused by the external force applied to at least one corner area of the display device may directly be applied to at least one corner area of the first adhesive layer 112 through the transistor substrate 106 and the color filter substrate 108 within a minimum range. Since the impact caused by the external force applied to at least one corner area of the display device is applied to the guide member 102 arranged below the transistor substrate 106, the impact applied to the first adhesive layer 112 may be absorbed. Therefore, the first adhesive layer 112 may be prevented from being damaged.

FIGS. 5A to 5D are cross-sectional views illustrating a second adhesive layer of a display device according to another example embodiment of the present invention.

FIGS. 5A to 5D illustrate another embodiment of the single sided adhesive member 120a arranged in at least one corner area of the second adhesive layer 120 of FIG. 4.

Figure 5A:
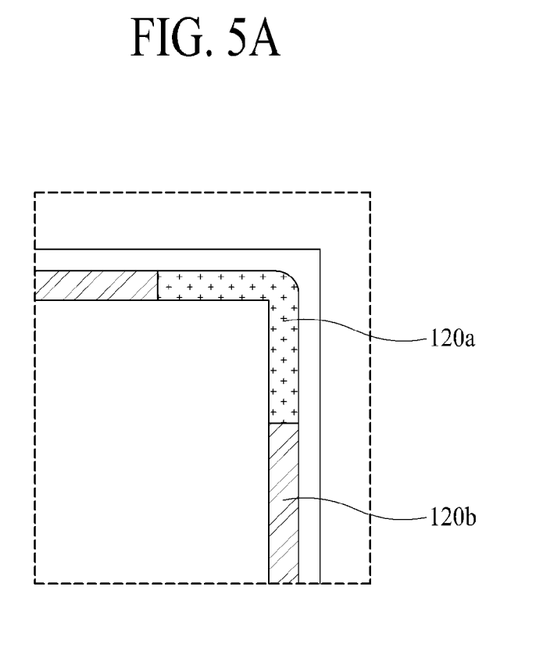
FIGS. 5A to 5D are cross-sectional views illustrating a second adhesive layer of a display device according to another example embodiment of the present invention.

FIG. 5A illustrates a structure that at least one corner area of the second adhesive layer 120 has a round shape. In the structure of the round shape, impact caused by the external force applied to at least one corner area of the display device may be applied to at least one corner area of the first adhesive layer 112 within a more minimum range than the one embodiment of the present invention.

Figure 5B:
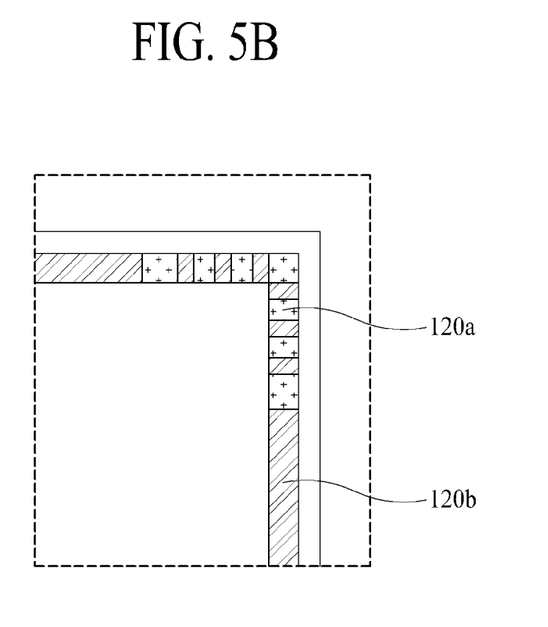

FIG. 5B illustrates a structure that the single sided adhesive member 120a and the double sided adhesive member 120b are alternately arranged in at least one corner area of the second adhesive layer 120. In the structure that the single sided adhesive member 120a and the double sided adhesive member 120b are alternately arranged, at least one corner area of the second adhesive layer 120 partially includes the double sided adhesive member 120b. Therefore, the adhesion between the transistor substrate 105 and the guide member 102 is more enhanced than the one embodiment of the present invention, whereby a gap is prevented from being generated between the transistor substrate 106 and the guide member 102. Since the single sided adhesive member 120a is also arranged in at least one corner area of the second adhesive layer 120, the impact caused by the external force applied to at least one corner area of the display device may be minimized.

Figure 5C:
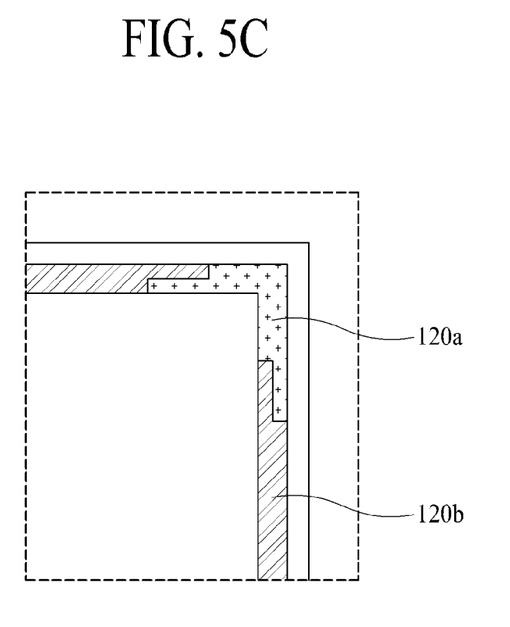

FIG. 5C illustrates that a boundary portion between the single sided adhesive member 120a and the double sided adhesive member 120b arranged in at least one corner area of the second adhesive layer 120 has a stair shape. In the stair shaped structure of the boundary portion, permeation of substances into the display device through the boundary portion between the double sided adhesive member 120b and the single sided adhesive member 120a may be more minimized than the one embodiment of the present invention. The stair shaped structure may minimize permeation of substances into an area facing the display panel may be minimized. Therefore, the light supplied from the light emitting portion to the display panel may be interfered by the substances within a minimum range. Therefore, the light emitting portion may supply uniform light to the display panel. Also, in the same manner as the embodiment of FIG. 4, the single sided adhesive member 120a may be arranged in at least one corner area of the second adhesive layer 120. Therefore, the impact caused by the external force may be minimized at least one corner area of the display device.

Figure 5D:
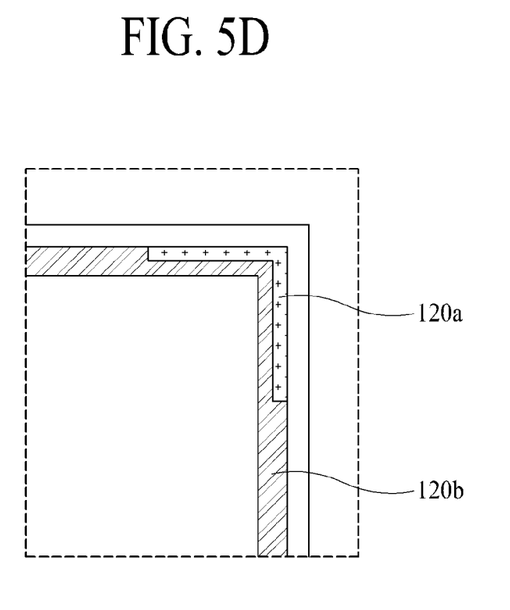

FIG. 5D illustrates that the single sided adhesive member 120a is arranged at the outside of at least one corner area of the second adhesive layer 120 while the double sided adhesive member 120b is arranged at the inside facing the outside. The double sided adhesive member 120b arranged at the inside of at least one corner area of the second adhesive layer 120 is overlapped with the transistor substrate 106, the color filter substrate 108 and the second polarizing layer 110, which are disposed on the double sided adhesive member 120b. Also, the double sided adhesive member 120b arranged at the inside of at least one corner area of the second adhesive layer 120 is attached to both the lower surface of the transistor substrate 106 and the upper surface of the guide member 102. The double sided adhesive member 120b arranged in at least one corner area of the second adhesive layer 120 may enhance the adhesion between the transistor substrate 106 and the guide member 102.

Also, the single sided adhesive member 120a arranged at the outside of at least one corner area of the second adhesive layer 120 may be overlapped with the transistor substrate 106. The overlapped portion of the single sided adhesive member 120a may be attached to the upper surface of the guide member 102 without being attached to the lower surface of the transistor substrate 106. The single sided adhesive member 120a minimizes the impact caused by the external force in at least one corner area of the display device from being directly applied to the first adhesive layer 112 through the transistor substrate 106, and applies the impact to the guide member 102 disposed below the transistor substrate 106. Therefore, the impact caused by the external force applied to the first adhesive layer 112 may be absorbed. That is, in the embodiment of FIG. 5D, the impact caused by the external force applied to at least one corner area of the display device may be applied to the inside of at least one corner area of the second adhesive layer 120 as compared with the one embodiment of the present invention. Therefore, the impact applied to at least one corner area of the first adhesive layer 112 may be minimized.

Although the structure of the display device according to the present invention has been described as above, the present invention is not limited to the above structure. For example, various panels may be used as the functional panel, and the light emitting portion may be formed in various structures. When the functional panel is attached to the upper portion of the polarizing layer, the functional panel may be applied to the display device of all structures that the functional panel is attached to the upper surface of the polarizing layer.

As described above, according to the present invention, the following advantages can be obtained.

The impact caused by the external force is absorbed by the adhesive enhancement layer arranged in the outer area of the polarizing layer on the color filter substrate, and the adhesive layer arranged between the non-display area of the transistor substrate and the light emitting portion, whereby the polarizing layer of the display area may be prevented from being delaminated from the functional panel. Thus, for example, delamination at an edge of a polarizing layer due to external impact can be prevented by using an adhesive member when a functional panel is attached to the display device.

Also, the upper surface of the adhesive enhancement layer may be disposed to be slanted or disposed in a curved shape, whereby the adhesive defect caused by a height difference between the polarizing layer and the adhesive enhancement layer may be avoided.

Also, the single sided adhesive member is arranged in at least one corner area of the adhesive layer, whereby the impact caused by the external force applied to the adhesive layer may be minimized.

Also, since the single sided adhesive member of the adhesive layer is attached to the guide member only, the impact caused by the external force applied to the adhesive layer is applied to the guide member, whereby the impact may be minimized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device, comprising:
  a display panel that includes a polarizing layer;
  a functional panel on the display panel;
  a first adhesive layer disposed between the polarizing layer and the functional panel and more extended than the polarizing layer;
  an adhesive enhancement layer contacting a side of the polarizing layer and enhancing adhesion between the first adhesive layer and the polarizing layer; and
  a second adhesive layer including a double sided adhesive member and a single sided adhesive member, and serving as adhesion and impact reduction between the display panel and a guide member.

2. The display device of claim 1, wherein the adhesive enhancement layer contacts the first adhesive layer and is thicker outwardly from the side of the polarizing layer.

3. The display device of claim 1, wherein the adhesive enhancement layer is either nonconductive polyethyleneterepthalate or silicon material.

4. The display device of claim 1, wherein the display panel further includes a transistor substrate and a color filter substrate, the polarizing layer is disposed on the color filter substrate, and the color filter substrate is disposed on the transistor substrate and more extended than the polarizing layer.

5. The display device of claim 4, further comprising a conductive tape between the adhesive enhancement layer and the color filter substrate.

6. The display device of claim 5, wherein the conductive tape is either ITO tape or IZO tape.

7. The display device of claim 4, wherein the transistor substrate further includes a display area and a non-display area surrounding the display area, and the second adhesive layer is disposed on the non-display area.

8. The display device of claim 1, wherein the single sided adhesive member is disposed in at least one corner area of the second adhesive layer.

9. The display device of claim 8, wherein the single sided adhesive member disposed in the at least one corner area has 'L' shape.

10. The display device of claim 8, wherein the double sided adhesive member and the single sided adhesive member are alternately arranged.

11. The display device of claim 8, wherein the at least one corner area has a round shape.

12. The display device of claim 8, wherein a boundary portion between the single sided adhesive member and the double sided adhesive member has a stair shape.

13. The display device of claim 8, wherein the single sided adhesive member is arranged at the outside of the corner area, and the double sided adhesive member is arranged at the inside facing the outside.

14. The display device of claim 1, wherein the single sided adhesive member is attached to the guide member.

15. The display device of claim 1, wherein the single sided adhesive member is attached to the display panel.

16. The display device of claim 15, wherein the single sided adhesive member is not attached to the display panel to minimize impact caused by an external force applied to the display panel.

17. The display device of claim 1, wherein the second adhesive layer is either nonconductive polyethylene-terepthalate or silicon material.

* * * * *